(12) United States Patent
Kerner

(10) Patent No.: US 8,004,857 B2
(45) Date of Patent: Aug. 23, 2011

(54) FIXING SYSTEM FOR PRINTED CIRCUIT BOARDS

(75) Inventor: Nikolaus Kerner, Wenzenbach (DE)

(73) Assignee: VDO Automotive AG, Munich (DE)

( * ) Notice: Subject to any disclaimer, the term of this patent is extended or adjusted under 35 U.S.C. 154(b) by 337 days.

(21) Appl. No.: 12/066,268

(22) PCT Filed: Jul. 27, 2006

(86) PCT No.: PCT/EP2006/064718
§ 371 (c)(1),
(2), (4) Date: Mar. 10, 2008

(87) PCT Pub. No.: WO2007/031360
PCT Pub. Date: Mar. 22, 2007

(65) Prior Publication Data
US 2008/0247146 A1 Oct. 9, 2008

(30) Foreign Application Priority Data

Sep. 14, 2005 (DE) .......................... 10 2005 043 880

(51) Int. Cl.
*H05K 7/14* (2006.01)
(52) U.S. Cl. ........................................ 361/796; 361/752
(58) Field of Classification Search .................. 361/760,
361/752, 753, 801, 796; 172/138 D, 138 G;
29/739, 757
See application file for complete search history.

(56) References Cited

U.S. PATENT DOCUMENTS

| 2,740,097 | A | * | 3/1956 | Edelman et al. ................. 439/75 |
| 3,736,471 | A | | 5/1973 | Donze et al. |
| 4,533,976 | A | | 8/1985 | Suwa |
| 4,644,614 | A | | 2/1987 | Mizusawa |
| 6,058,024 | A | | 5/2000 | Lyford |
| 6,215,667 | B1 | * | 4/2001 | Ady et al. ...................... 361/752 |
| 7,028,389 | B2 | * | 4/2006 | Chang ............................. 29/739 |
| 2008/0055870 | A1 | * | 3/2008 | Callahan et al. ............... 361/752 |

FOREIGN PATENT DOCUMENTS

| CN | 2638402 | Y | | 9/2004 |
| DE | 9112371 | U1 | | 2/1993 |
| DE | 10134562 | A1 | | 2/2003 |
| EP | 0892594 | A2 | | 1/1999 |
| EP | 1524893 | A1 | | 4/2005 |
| IT | EP1524893 | A1 | * | 4/2005 |

* cited by examiner

*Primary Examiner* — Yuriy Semenenko
(74) *Attorney, Agent, or Firm* — Laurence A. Greenberg; Werner H. Stemer; Ralph E. Locher

(57) ABSTRACT

A fixing system for printed circuit boards arranged one above the other in an electronics housing, in particular, for automotive applications. One printed circuit board is fixed to the electronics housing by a rigid fixing means. The other printed circuit boards are fixed to the electronics housing by a resilient fixing means.

10 Claims, 7 Drawing Sheets

FIG 9
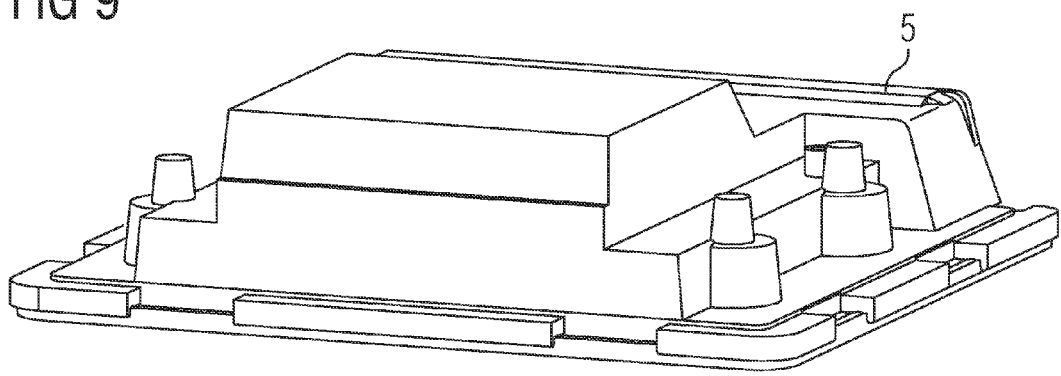
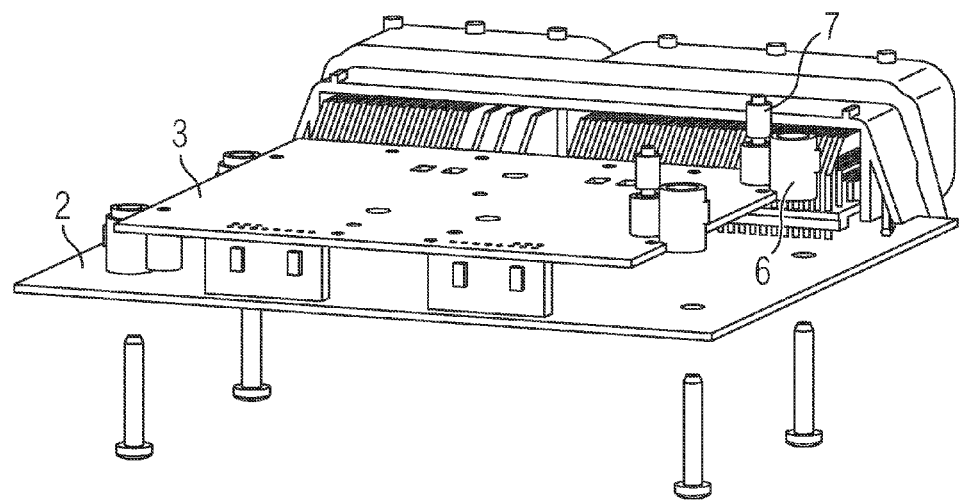
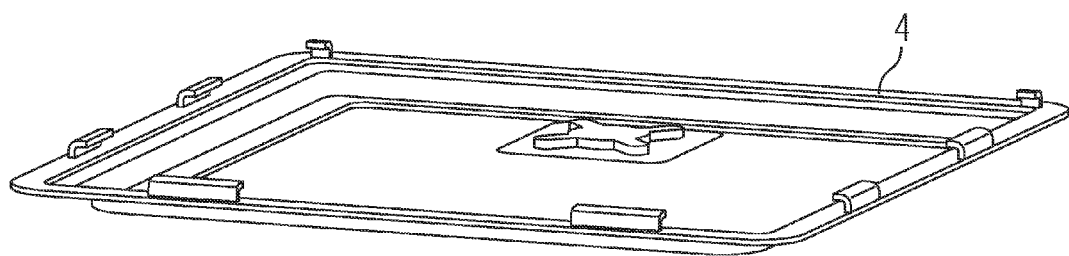

FIXING SYSTEM FOR PRINTED CIRCUIT BOARDS

BACKGROUND OF THE INVENTION

1. Field of the Invention

The invention relates to a fixing system for printed circuit boards arranged one above the other in an electronics housing, especially for the automotive industry.

As a result of increasing demands imposed on the functionality of electronic control units in the field of engine management, devices are increasingly being designed with a number of printed circuit boards. In such cases conflicting requirements are increasingly arising as regards the mechanical design. On the one hand the electronics must be well cooled, meaning that only narrow and not very variable gaps are able to be considered for a thermal transition region. On the other the printed circuit boards should not be distorted mechanically in order to avoid reliability problems resulting from broken components or connections between components and printed circuit boards. The even spacings for a thermal transition region can be implemented by screwing the individual printed circuit boards onto the heat sink in a defined manner. However a relatively large amount of space on the printed circuit boards is used for the fixing elements. There are also technical layout restrictions to be considered because of the numerous large breakthroughs in the printed circuit boards. If the connecting elements are reduced there must be common fixings to the remaining two printed circuit boards. The result of this is that different gaps are produced by different tolerance chains and thus also a different thermal efficiency.

In this connection a system is known from DE 101 34 562 A1 for electrical contacting and mechanical fixing of printed circuit boards, which features at least one cutting element or insulation piercing connecting element for placement on the underside of a printed circuit board and a fixing element on the printed circuit board. In order to ensure a simple and fast assembly or disassembly, a support is fixed with regard to at least one conducting wire in such a manner that when mechanically fixing the printed circuit board to the support by means of the fixing element situated on the printed circuit board, the at least one conducting wire can be directly contacted essentially at the same time by means of the cutting element or insulation piercing connecting element on the underside of the printed circuit board.

The disadvantage of the prior art is that rigidly-mounted printed circuit boards will be deformed under the effect of heat, which can damage the electrical components on the circuit board or the electrical contacting. The non-stress-free support of the printed circuit boards when affected by heat also means that it is not possible to guarantee a thermally-optimized construction with defined thermal transition regions. Added to this is the fact that the mounting space on the circuit board is significantly restricted by the screw fixings.

BRIEF SUMMARY OF THE INVENTION

Using this as its starting point, the object of the present invention lies in creating a fixing system for printed circuit boards arranged one above the other which makes it possible for the printed circuit boards to be mounted in a stress-free manner, but in the process, forms defined thermal transition regions, and which requires little space on the circuit board.

This object is achieved by a fixing system with the features of claim 1. Advantageous embodiments and developments, which can be used individually or in combination, are the subject matter of the dependent claims.

The outstanding aspect of the inventive fixing system for printed circuit boards arranged one above the other in an electronics housing is that one circuit board is fixed by a rigid fixing means to the electronics housing and all further printed circuit boards are fixed by sprung fixing means. The inventive embodiment of the fixing system makes possible a secure positioning of the printed circuit boards one above the another, which can be undertaken outside the housing before the printed circuit boards are moved towards each other by the flexible spring element and are inserted into the electronics housing. Preferably the circuit board which is closest to the floor of the housing is fixed by rigid fixing means, such as screws for example. The further printed circuit boards arranged above it in the direction of the housing cover can then be positioned by the sprung fixing means. The inventive fixing system makes it possible to arrange a number of printed circuit boards one above the other, with the fixing means themselves needing little space on the circuit board. In addition it is possible to set the optimum thermal transition regions between housing cover and printed circuit boards.

Preferably the sprung fixing means is made of an electrically-conductive material such as metal for example, so that no additional electrical connections have to be embodied between the printed circuit boards. In addition metal is also insensitive to ageing processes.

It is preferred for the sprung fixing means to have a U-shaped center area, with two side limbs running in parallel and one base limb. This center area of the sprung fixing means serves to provide play which is exploited when the two printed circuit boards are moved towards each other on insertion into the electronics housing.

It is of advantage for an L-shaped area to be formed in each case on the side limbs of the U-shaped center area, with the longer L-limbs serving as spacing elements and the shorter L-limbs resting on the upper side of the lower circuit board or on the lower side of the upper circuit board. The shaping of the inventive sprung fixing means thus fulfills three functions. The U-shaped center area provides an area of play to enable the printed circuit boards positioned one above the other to be inserted into the electronics housing without any problems. The longer L limbs serve as spacers and the shorter L limbs serve as the electrical connection between the printed circuit boards arranged one above the other.

Preferably the L-shaped area embodied towards the sprung-supported circuit board is shaped as a circuit board support, so that the sprung-supported circuit board is anchored securely positioned and is not knocked out of place during installation in the electronics housing.

It is also preferable for the sprung fixing means to be embodied as an elastomer spring. The elastomer spring provides vibration-damping secure support for the circuit board. Elastomers are stable, but elastically-deformable plastics. As a rule elastomers involve polymers or polyaducts. The macromolecules of elastomers are only connected to each other at a few points and form a broadly-meshed spatial network. They thereby exhibit high elasticity. The plastics can deform during tensile and compressive stress but then return to their initial shape. They can thus not be permanently plastically deformed. Elastomers are not meltable, i.e., even at higher temperatures in the electronics housing no ageing processes or embrittlements are to be expected.

It is preferable to support the elastomer spring in a holder. This creates a firm fixing of the elastomer springs which overall produces a stable, fixed-position fixing system able to be adapted to the individual conditions for circuit boards arranged one above the other in an electronics housing.

The present invention advantageously creates for the first time a fixing system for printed circuit boards arranged one above the other in an electronics housing which makes it possible to supported the printed circuit boards in a stress-free manner, but in the process embodies defined thermal transition regions, and which requires little space on the circuit board. It is especially suitable for the automotive industry.

Further advantages and embodiments of the invention will be explained below with reference to exemplary embodiments as well as with reference to the drawing.

BRIEF DESCRIPTION OF THE SEVERAL VIEWS OF THE DRAWING

The figures show schematically:

FIG. 9 an exploded view of an electronics housing with fixing system as depicted in FIG. 8;

DESCRIPTION OF THE INVENTION

Figure 1:
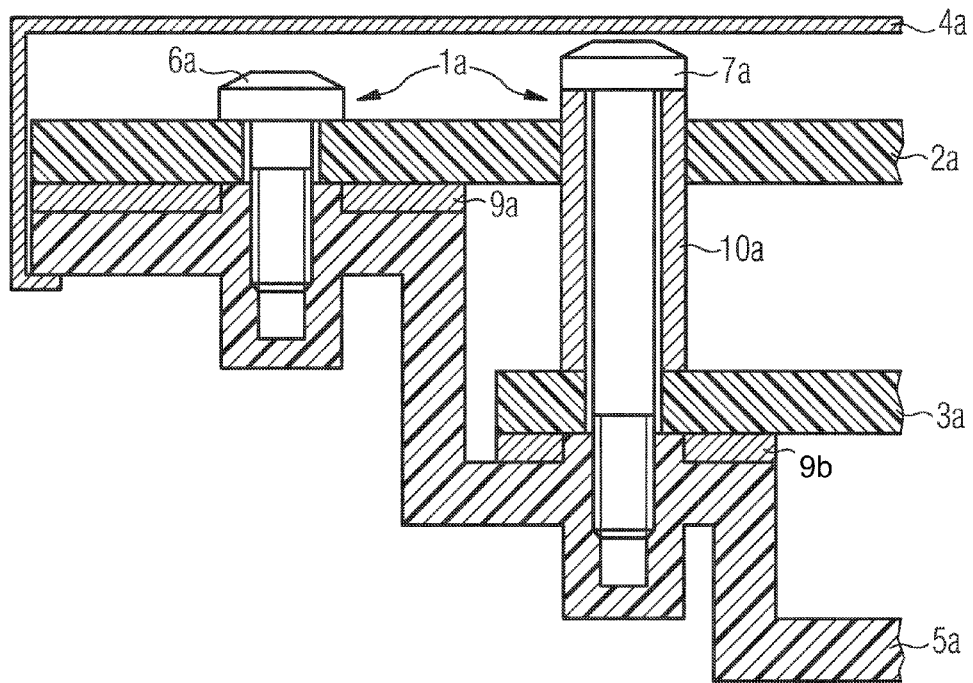
FIG. 1 a cross-sectional view of a fixing known from the prior art for printed circuit boards arranged one above the other.

FIG. 1 shows a cross-sectional view of a fixing known from the prior art for printed circuit boards 2a, 3a arranged one above the other in an electronics housing embodied in two pieces with housing floor 4a and housing cover 5a. In this case the circuit board 2a is fixed via a screw 6a to the housing cover 5a. The circuit board 3a is fixed via a screw 7a, which passes through both an opening 8a in circuit board 2a and also through the circuit board 3a to the housing cover 5a. This arrangement produces intermediate thermal layers 9a between the printed circuit boards 2a, 3a and the housing cover 5a. The screw 7a has an elongated stem which serves as a spacer 10a.

The disadvantage in this case is that by fitting the screw 7a on the circuit board 2a the installation space to be used on the circuit board 2a is considerably restricted.

Figure 2:
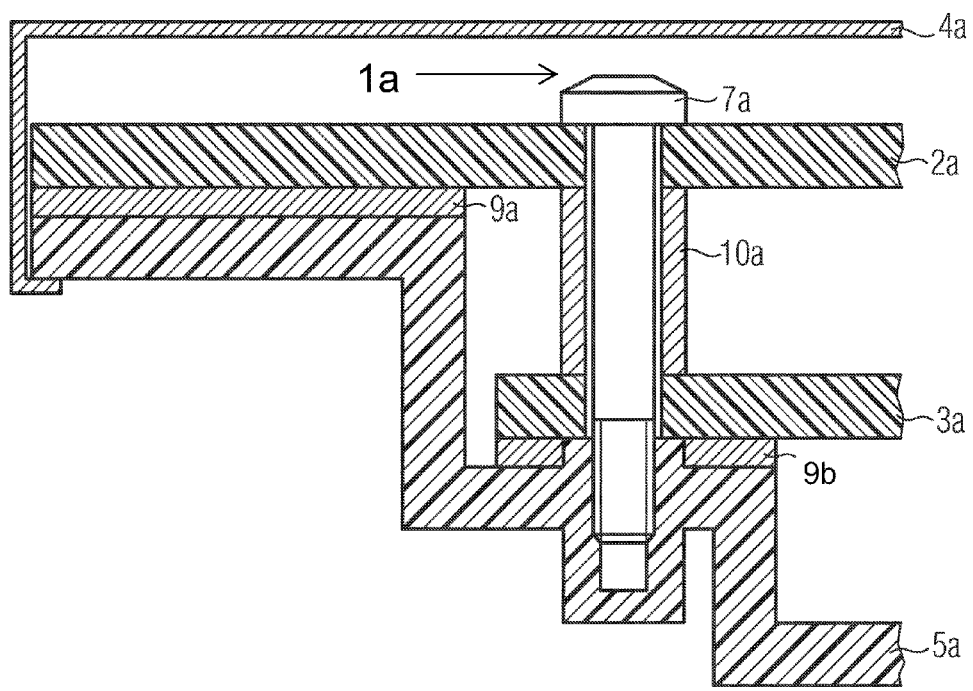
FIG. 2 a cross-sectional view of a further fixing known from the prior art for printed circuit boards arranged one above the other.

FIG. 2 shows a cross-sectional view of a further fixing 1a known from the prior art for printed circuit boards 2a, 3a arranged one above the other in an electronics housing embodied in two pieces with housing floor 4a and housing cover 5a. In this case both circuit board 2a and also the circuit board 3a are fixed via one screw 7a which passes through both printed circuit boards 2a, 3a and thus also serves as a spacer 10a, to the housing cover 5a. Between printed circuit boards 2a, 3a and the housing cover 5a are located intermediate thermal layers 9a, 9b, with the intermediate layer 9a not being embodied in a defined way since there was no specific fixing of the circuit board 2a to the housing cover 5a.

Figure 3:
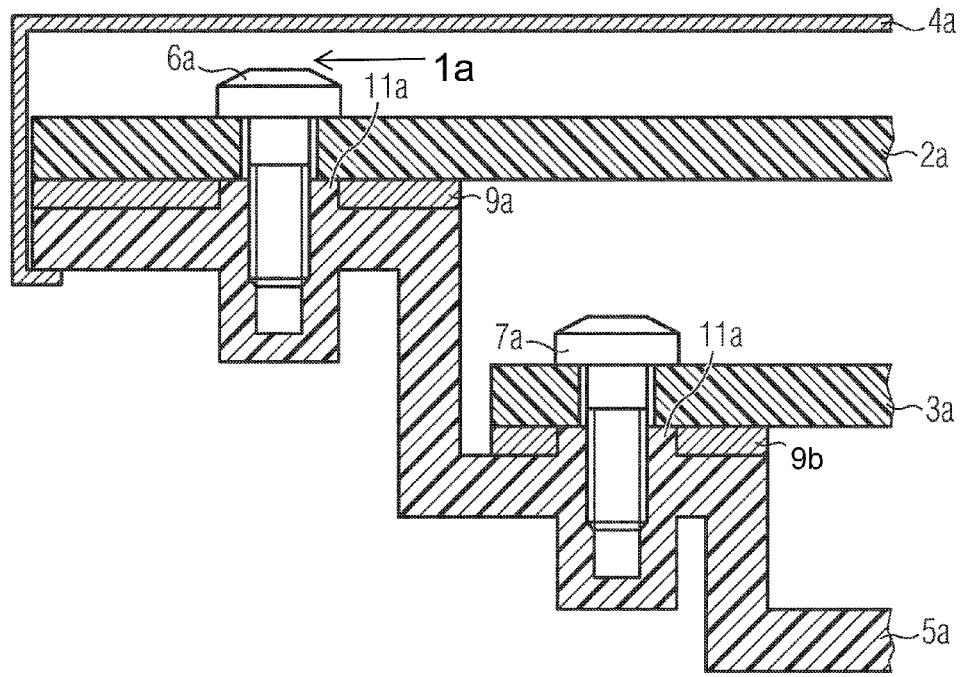
FIG. 3 a cross-sectional view of a further fixing known from the prior art for printed circuit boards arranged one above the other.

FIG. 3 shows a cross-sectional view of a further fixing 1a known from the prior art for printed circuit boards 2a, 3a arranged one above the other in an electronics housing embodied in two pieces with housing floor 4a and housing cover 5a.

Both circuit board 2a and also circuit board 3a are fixed by the same form of screw 6a, 7a to housing cover 5a. To make a defined intermediate thermal layer 9a, 9b possible between printed circuit boards 2a, 3a and the housing cover 5a guide flanges 11a are formed into housing cover 5a for the screws 6a, 7a.

The disadvantage of this arrangement is that the printed circuit boards 2a, 3a must be inserted into the electronics housing and screwed-on in turn and that an electrical connection must additionally be made between the printed circuit boards 2a, 3a.

Figure 4:
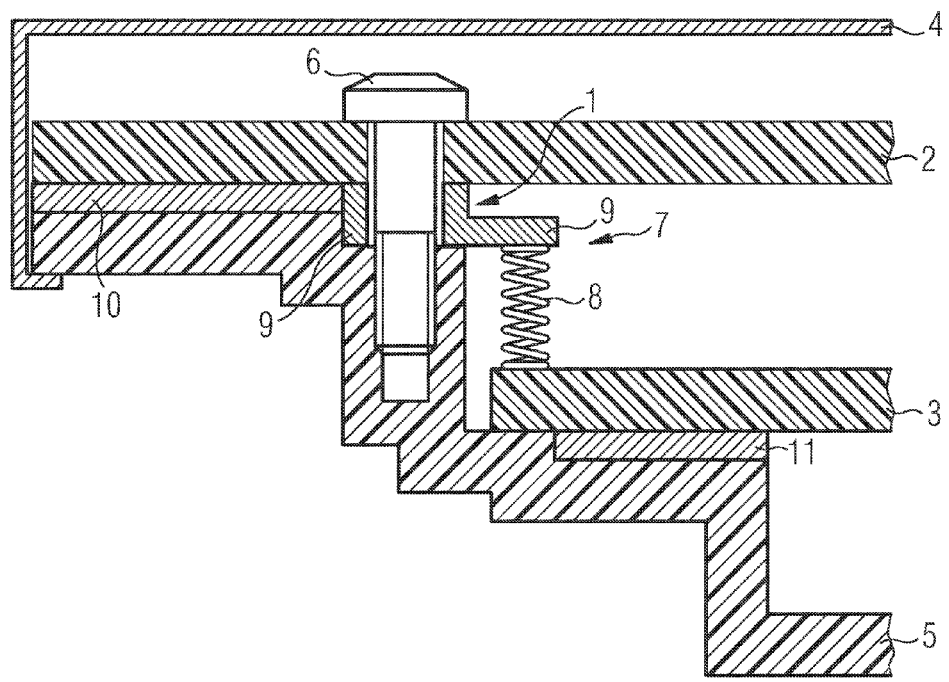
FIG. 4 a cross-sectional view of a first exemplary embodiment of an inventive fixing system.

FIG. 4 shows a cross-sectional view of a first exemplary embodiment of an inventive fixing system 1, for printed circuit boards 2, 3 arranged one above the other in a preferably two-piece molded electronics housing with housing floor 4 and housing cover 5. The fixing system 1 preferably embodied in at least two parts feature a rigid fixing means 6 such as a screw for example and a sprung fixing means 7 preferably embodied from a thermally and electrically-conductive material such as a metal spring for example. The rigid fixing means 6 preferably fixes the circuit board 2 lying closest to the housing floor 4 to the housing cover 5. The sprung fixing means 7 is preferably formed in one piece and features an area embodied like a spring 8 and an area 9 serving as a spacer. A defined intermediate thermal layer 10 between circuit board 4 and housing cover 5 is embodied by the function of the spacer. The pressure force of the spring effect of the sprung fixing means 7 also creates a defined intermediate thermal layer 11 between the circuit board 3 and the housing cover 5.

Figure 5:
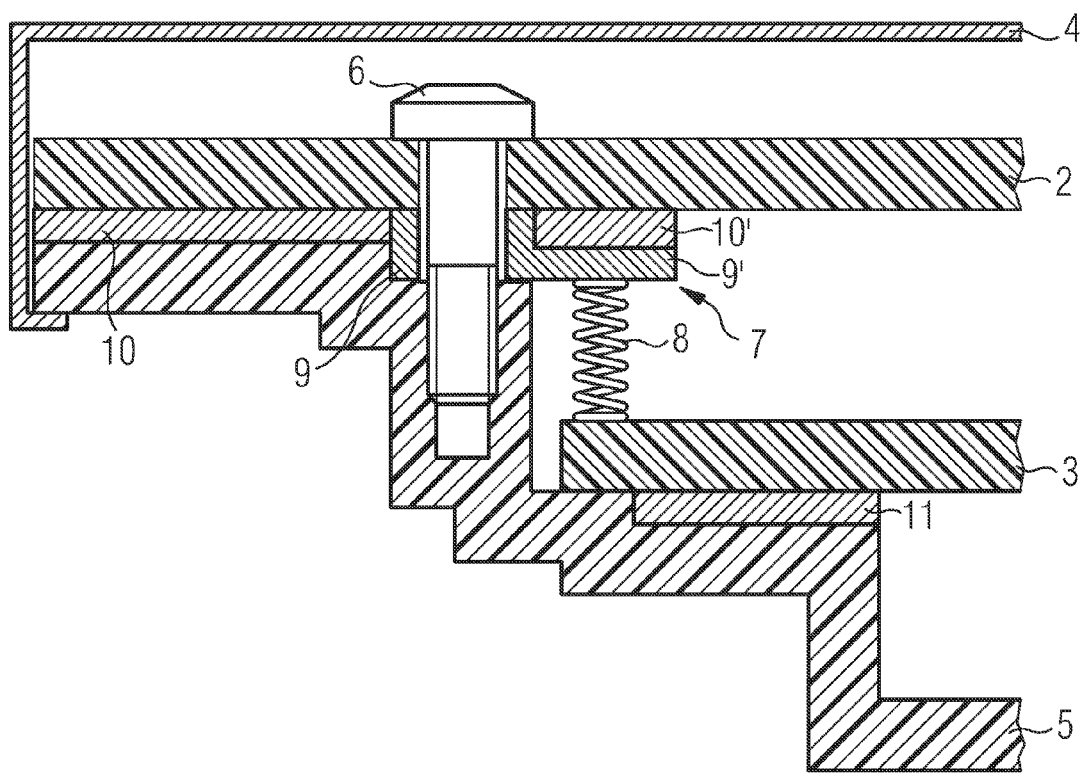
FIG. 5 a cross-sectional view of a second exemplary embodiment of the inventive fixing system.

FIG. 5 shows a cross-sectional view of a second exemplary embodiment of the inventive fixing system 1, for printed circuit boards 2, 3 arranged one above the other in a preferably two-piece molded electronics housing with housing floor 4 and housing cover 5. FIG. 5 shows as a new aspect that the intermediate thermal layer 10 arranged between circuit board 2 and housing cover 5 can be expanded by shaping the spacers 9, 9' of the sprung fixing means 7 around the intermediate layer 10', if particular conditions in the electronics housing require this.

Figure 6:
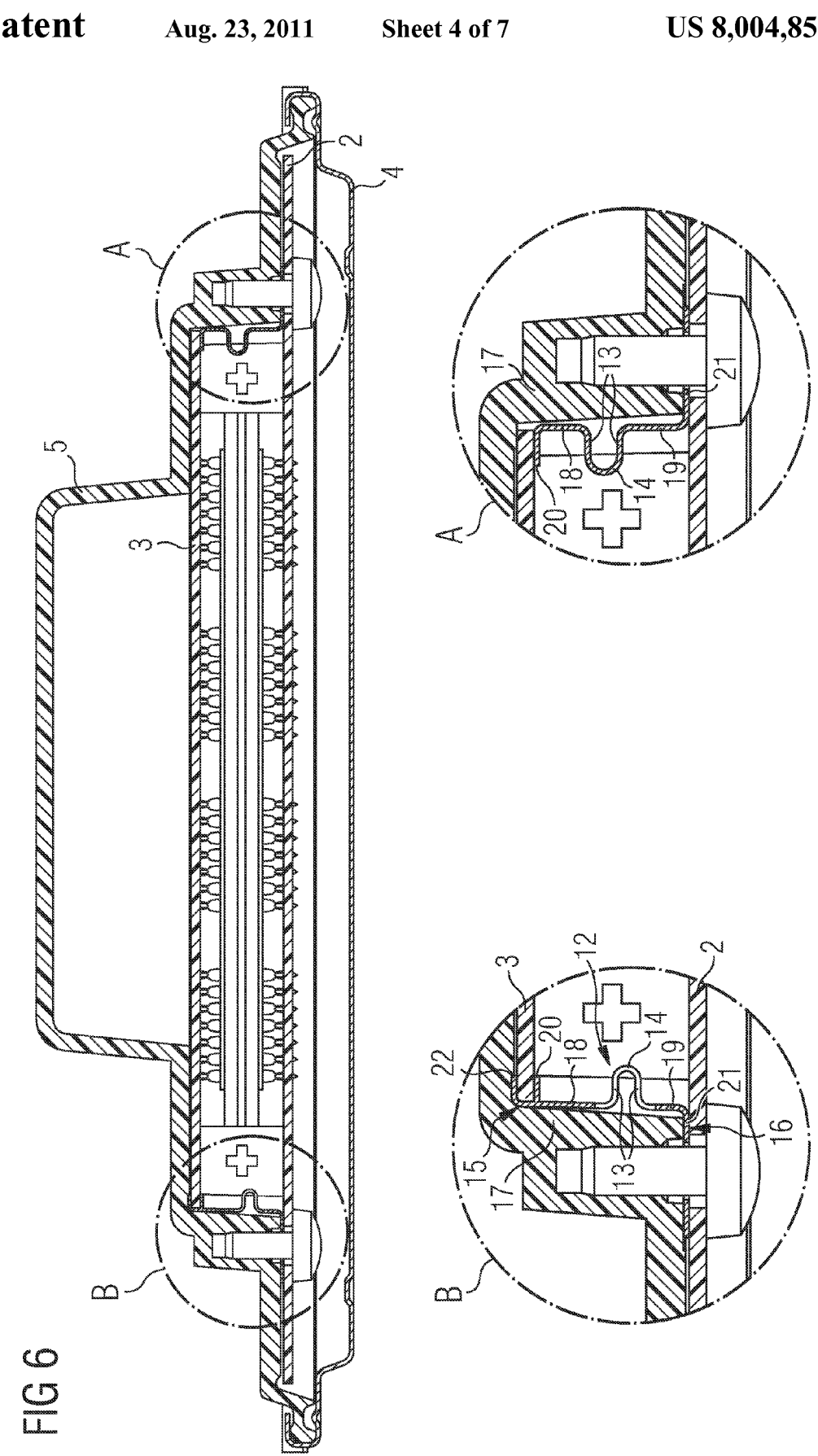
FIG. 6 a cross-sectional view of a further exemplary embodiment of the inventive fixing system in the electronics housing.

FIG. 6 shows a cross-sectional view of a further exemplary embodiment of the inventive fixing system 1 in an electronics housing. The sprung fixing means 7 has a U-shaped center section 12 with two side limbs 13 running in parallel to each other and a base limb 14. On the side limbs 13 L-shaped areas 15, 16 are formed onto the U-shaped center area 12. In this case the limbs 18, 19 of the L-shaped areas 15, 16 running in parallel to the housing cover side wall 17 act as spacers. The limbs 20, 21 running at right angles to the housing side wall 17 and thus in parallel to the printed circuit boards 2, 3 make possible the electrical connection between the printed circuit boards 3 arranged one above the other. Preferably a circuit board holder 22 can be formed on the limb 18, preferably embodied in a U shape and holding the circuit board 3 in a fixed position.

Figure 7:
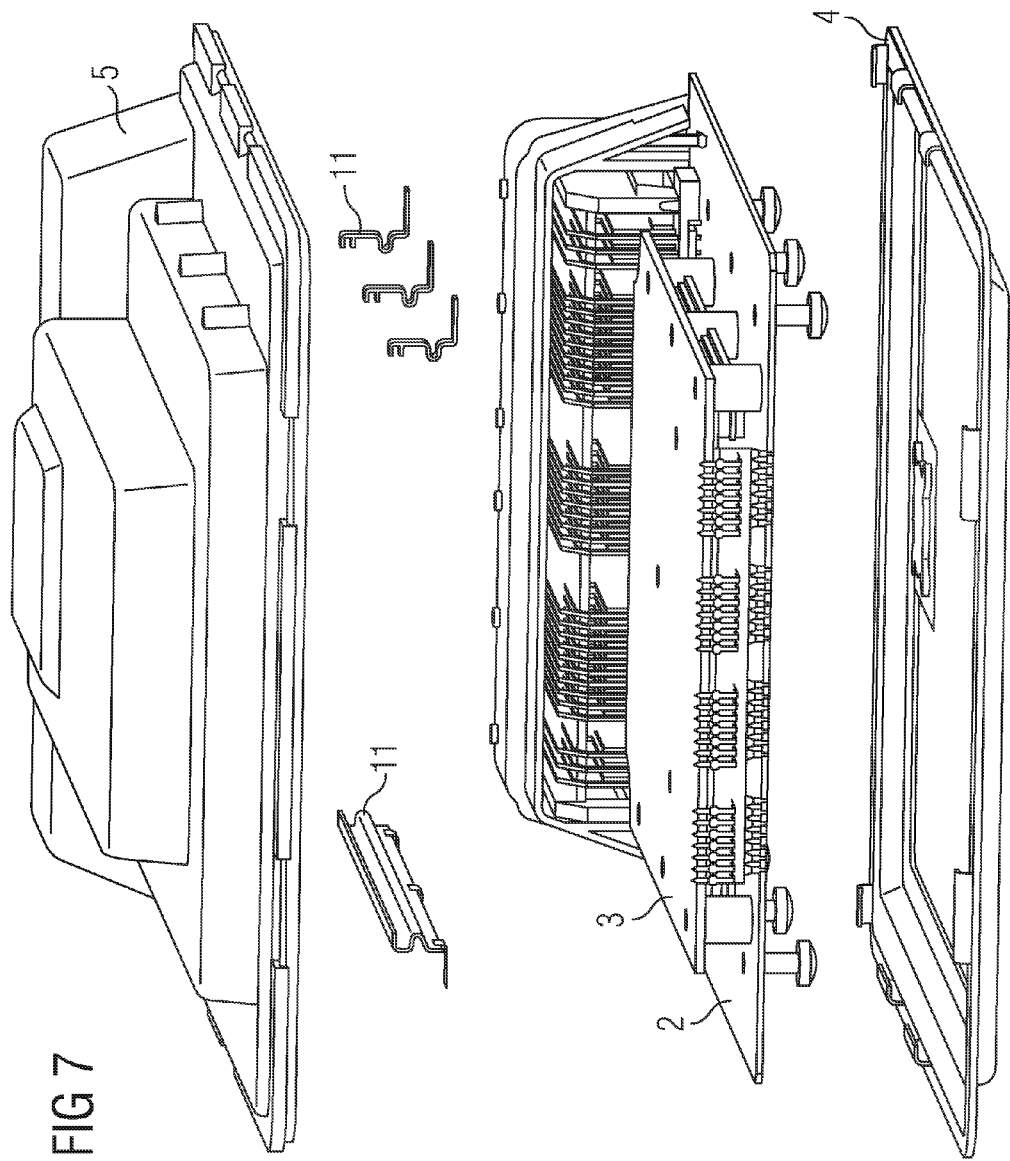
FIG. 7 an exploded view of an electronics housing with fixing system as depicted in FIG. 6.

FIG. 7 shows in an exploded view of an electronics housing with the inventive fixing system 1 as depicted in FIG. 6. The figure shows the housing floor 4 as well as the housing cover 5 of the electronics housing with printed circuit boards 2, 3 arranged one above the other which are positioned in relation to each other by the sprung fixing means 7.

Figure 8:
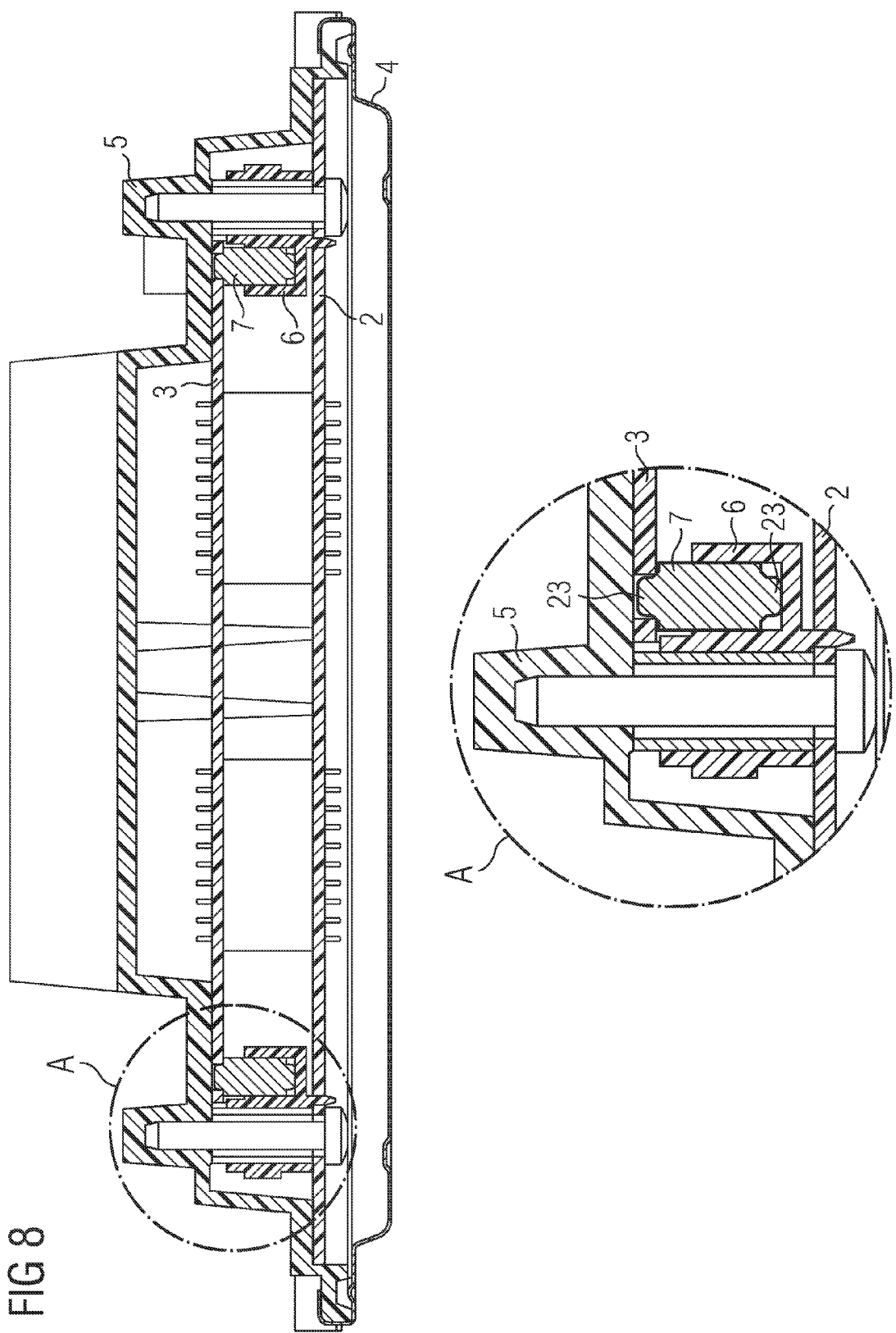
FIG. 8 a cross-sectional view of a second exemplary embodiment of the inventive fixing system in the electronics housing.

FIG. 8 shows a cross-sectional view of a second exemplary embodiment of the inventive fixing system 1. The fixing system 1, preferably embodied in at least two parts, features a sprung fixing means 7 which is embodied as an elastomer spring and a rigid fixing means 6 which serves as a holder for the elastomer spring. The sprung fixing means 7 is preferably shaped like a type of block, with the corner elements of the block having been removed in order to simplify the positioning of the elastomer spring in the holder or on the circuit board 6. The upper or lower side of the block features a lip-type embodiment 23 which makes it easier to introduce the block into the holder.

FIG. 9 shows an exploded view of an electronics housing with the fixing system as depicted in FIG. 8. The figure shows the housing floor 4 as well as the housing cover 5 of the electronics housing with printed circuit boards 2, 3 arranged one above the other. The inventive fixing system 1 is embodied here as a block-type elastomer spring with holder which serves as rigid fixing means and which enables the spring 7 to be firmly positioned.

The present invention advantageously creates for the first time a fixing system 1 for printed circuit boards 2, 3 arranged one above the other in an electronics housing, which makes it possible to support the printed circuit boards 2, 3 in a stress-free manner, but in the process embodies defined thermal transition regions, and which requires little space on the circuit board. It is especially suitable for the automotive industry.

The invention claimed is:

1. An improved fixing system for printed circuit boards disposed one above the other, the improvement which comprises:
   an electronics housing including a housing cover;
   rigid fixing means for rigidly fixing a printed circuit board to the electronics housing;
   resilient fixing means for resiliently pressing at least one further printed circuit board against the housing; and
   an intermediate thermal layer disposed between said printed circuit board and the housing cover;
   said resilient fixing means made of an elastomer spring.

2. The fixing system according to claim 1, configured for use in an automotive application.

3. The fixing system according to claim 1, wherein said resilient fixing means comprises a U-shaped center area, two mutually parallel lateral side limbs, and a base limb.

4. The fixing system according to claim 3, which comprises L-shaped portions formed on said lateral side limbs of said U-shaped center section.

5. The fixing system according to claim 4, wherein a circuit board support is embodied on said L-shaped portion of said resilient fixing means.

6. The fixing system according to claim 1, wherein said resilient fixing means is an elastomer spring.

7. The fixing system according to claim 6, wherein said resilient fixing means is embodied as a holder.

8. An electronics assembly, comprising:
   an electronics housing including a housing cover;
   a plurality of printed circuit boards disposed one above the other in said electronics housing, said printed circuit boards including a first circuit board and one or more further circuit boards;
   a fixing system for mounting said printed circuit boards in said electronics housing, said fixing system including rigid fixing means for rigidly mounting said first circuit board in said housing and resilient fixing means for resiliently pressing said one or more further circuit boards against said electronics housing; and
   an intermediate thermal layer disposed between one of said plurality of printed circuit board and the housing cover;
   said resilient fixing means made of an elastomer spring.

9. The electronics assembly according to claim 7, configured for use in an automotive application.

10. An improved fixing system for printed circuit boards disposed one above the other, the improvement which comprises:
    an electronics housing including a housing cover;
    a rigid fastener disposed to rigidly fix a printed circuit board to the electronics housing;
    a resilient fastener disposed to resiliently press at least one further printed circuit board against the housing; and
    an intermediate thermal layer disposed between said printed circuit board and the housing cover;
    said resilient fastener made of an elastomer spring.

* * * * *